(12) United States Patent
Gattere et al.

(10) Patent No.: US 11,865,581 B2
(45) Date of Patent: Jan. 9, 2024

(54) ULTRASONIC MEMS ACOUSTIC TRANSDUCER WITH REDUCED STRESS SENSITIVITY AND MANUFACTURING PROCESS THEREOF

(71) Applicant: STMICROELECTRONICS S.R.L., Agrate Brianza (IT)

(72) Inventors: Gabriele Gattere, Castronno (IT); Carlo Valzasina, Gessate (IT); Federico Vercesi, Milan (IT); Giorgio Allegato, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 985 days.

(21) Appl. No.: 16/684,289

(22) Filed: Nov. 14, 2019

(65) Prior Publication Data

US 2020/0156114 A1 May 21, 2020

(30) Foreign Application Priority Data

Nov. 21, 2018 (IT) .................. 102018000010485

(51) Int. Cl.
*B06B 1/06* (2006.01)
*B81B 7/00* (2006.01)
*B81C 1/00* (2006.01)

(52) U.S. Cl.
CPC .......... *B06B 1/0681* (2013.01); *B06B 1/0666* (2013.01); *B81B 7/0016* (2013.01); *B81C 1/00825* (2013.01); *B81B 2201/0264* (2013.01); *B81B 2201/0271* (2013.01); *B81B 2203/0127* (2013.01); *B81B 2203/0163* (2013.01)

(58) Field of Classification Search
CPC ...... B06B 1/0666; B06B 1/0681; H10N 30/88
USPC ....................... 310/322, 334, 348
See application file for complete search history.

(56) References Cited

U.S. PATENT DOCUMENTS

| 6,870,445 | B2 | 3/2005 | Kawakubo et al. |
| 7,227,429 | B2 | 6/2007 | Kawachi et al. |
| 7,344,907 | B2 | 3/2008 | Colgan et al. |
| 7,767,484 | B2 | 8/2010 | Ayazi |

(Continued)

FOREIGN PATENT DOCUMENTS

| CN | 1534869 A | 10/2004 |
| CN | 1632546 A | 6/2005 |

(Continued)

OTHER PUBLICATIONS

U.S. Appl. No. 16/207,035, filed Nov. 30, 2018, Micro-Electro-Mechanical Device and Manufacturing Process Thereof.

(Continued)

*Primary Examiner* — Derek J Rosenau
(74) *Attorney, Agent, or Firm* — Seed IP Law Group LLP

(57) ABSTRACT

An ultrasonic MEMS acoustic transducer formed in a body of semiconductor material having first and second surfaces opposite to one another. A first cavity extends in the body and delimits at the bottom a sensitive portion, which extends between the first cavity and the first surface of the body. The sensitive portion houses a second cavity and forms a membrane that extends between the second cavity and the first surface of the body. An elastic supporting structure extends between the sensitive portion and the body and is suspended over the first cavity.

20 Claims, 13 Drawing Sheets

(56) References Cited

U.S. PATENT DOCUMENTS

| | | | |
|---|---|---|---|
| 7,928,960 | B2 | 4/2011 | Baldo et al. |
| 8,173,513 | B2 | 5/2012 | Villa et al. |
| 9,233,834 | B2 | 1/2016 | Faralli et al. |
| 9,688,531 | B2 | 6/2017 | Baldo et al. |
| 10,626,008 | B2 | 4/2020 | Baldo et al. |
| 2005/0208696 | A1 | 9/2005 | Villa et al. |
| 2006/0157808 | A1 | 7/2006 | Matsuo |
| 2006/0203326 | A1 | 9/2006 | Fu |
| 2006/0284516 | A1* | 12/2006 | Shimaoka ............. H04R 19/04 310/322 |
| 2008/0013405 | A1 | 1/2008 | Moon et al. |
| 2008/0224242 | A1 | 9/2008 | Villa et al. |
| 2009/0115008 | A1 | 5/2009 | Ziglioli et al. |
| 2010/0096714 | A1 | 4/2010 | Nakatani |
| 2010/0164025 | A1 | 7/2010 | Yang |
| 2010/0170324 | A1 | 7/2010 | Mastromatteo et al. |
| 2010/0284553 | A1 | 11/2010 | Conti et al. |
| 2010/0330721 | A1 | 12/2010 | Barlocchi et al. |
| 2012/0018819 | A1 | 1/2012 | Ferrera et al. |
| 2014/0299949 | A1 | 10/2014 | Conti et al. |
| 2015/0001645 | A1 | 1/2015 | Faralli et al. |
| 2015/0001651 | A1 | 1/2015 | Faralli et al. |
| 2015/0265245 | A1 | 9/2015 | von Ramm et al. |
| 2016/0119722 | A1 | 4/2016 | Chu et al. |
| 2016/0167945 | A1 | 6/2016 | Chang et al. |
| 2016/0318757 | A1 | 11/2016 | Chou et al. |
| 2017/0001857 | A1 | 1/2017 | Jeong et al. |
| 2017/0021391 | A1 | 1/2017 | Guedes et al. |
| 2017/0144881 | A1 | 5/2017 | Baldo et al. |
| 2017/0186940 | A1 | 6/2017 | Bevilacqua et al. |
| 2017/0253477 | A1 | 9/2017 | Baldo et al. |
| 2018/0127263 | A1 | 5/2018 | Tai et al. |
| 2018/0178251 | A1 | 6/2018 | Foncellino et al. |
| 2019/0259932 | A1 | 8/2019 | Procopio et al. |
| 2023/0129720 | A1 | 4/2023 | Giusti et al. |

FOREIGN PATENT DOCUMENTS

| | | |
|---|---|---|
| CN | 104249990 A | 12/2014 |
| CN | 106744649 A | 5/2017 |
| CN | 106915722 A | 7/2017 |
| CN | 107265395 A | 10/2017 |
| EP | 2096448 A2 | 9/2009 |
| EP | 1577656 B1 | 6/2010 |
| EP | 2789578 A2 | 10/2014 |
| JP | H08201569 A | 8/1996 |
| WO | WO 2009096576 A2 | 8/2009 |
| WO | WO 2011078218 A1 | 6/2011 |

OTHER PUBLICATIONS

Huang et al., "Capacitive Micromachined Ultrasonic Transducers with Piston-Shaped Membranes: Fabrication and Experimental Characterization," *IEEE Transactions on Ultrasonics, Ferroelectrics, and Frequency Control* 56(1):136-145, 2009.

Lu et al., "A High Fill-Factor Annular Array of High Frequency Piezoelectric Micromachined Ultrasonic Transducers," *Journal of Microelectromechanical Systems* 24(4):904-913, 2015.

Lu et al., "High Frequency and High Fill Factor Piezoelectric Micromachined Ultrasonic Transducers Based on Cavity SOI Wafers," *Solid-State Sensors, Actuators and Microsystems Workshop*, Hilton Head Island, South Carolina, Jun. 8-12, 2014, pp. 131-134.

Qiu et al., "Piezoelectric Micromachined Ultrasound Transducer (PMUT) Arrays for Integrated Sensing, Actuation and Imaging," *Sensors* 15:8020-8041, 2015.

Sato et al., "A New Substrate Engineering for the Formation of Empty Space in Silicon (ESS) Induced by Silicon Surface Migration," *IEDM*, 1999, pp. 517-520.

Wang et al., "A Piezoelectric Micromachined Ultrasonic Transducer Using Piston-Like Membrane Motion," *IEEE Electron Device Letters* 36(9):957-959, 2015.

Yamashita et al., "Arrayed ultrasonic microsensors with high directivity for in-air use using PZT thin film on silicon diaphragms," *Sensors and Actuators A* 97-98:302-307, 2002.

Yang et al., "An Ultra-High Element Density pMUT Array with Low Crosstalk for 3-D Medical Imaging," *Sensors* 13:9624-9634, 2013.

Fischer et al., "Integrating MEMS and ICs," *Microsystems & Nanoengineering*, (2015) 1, 15005, 16 pages.

* cited by examiner

Known Art

Known Art

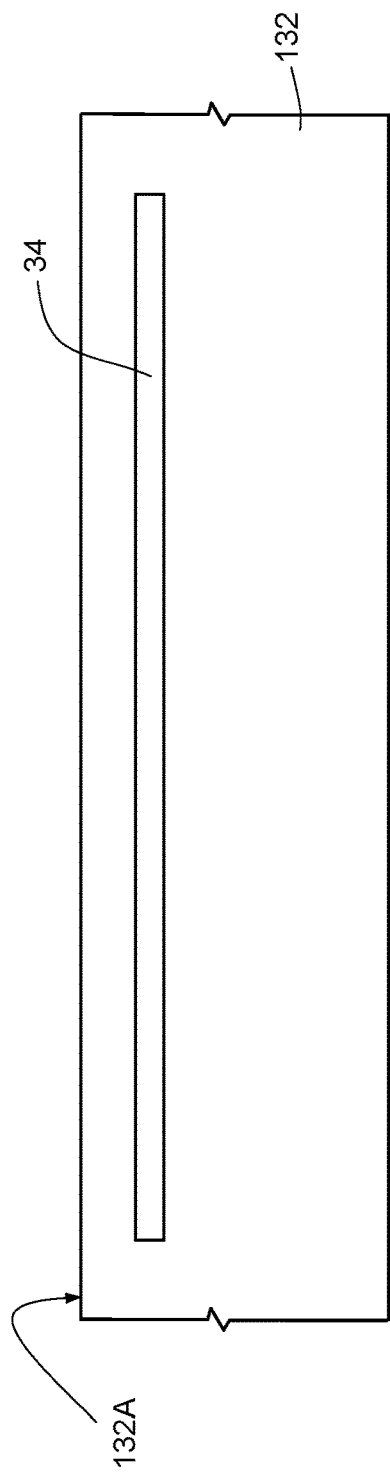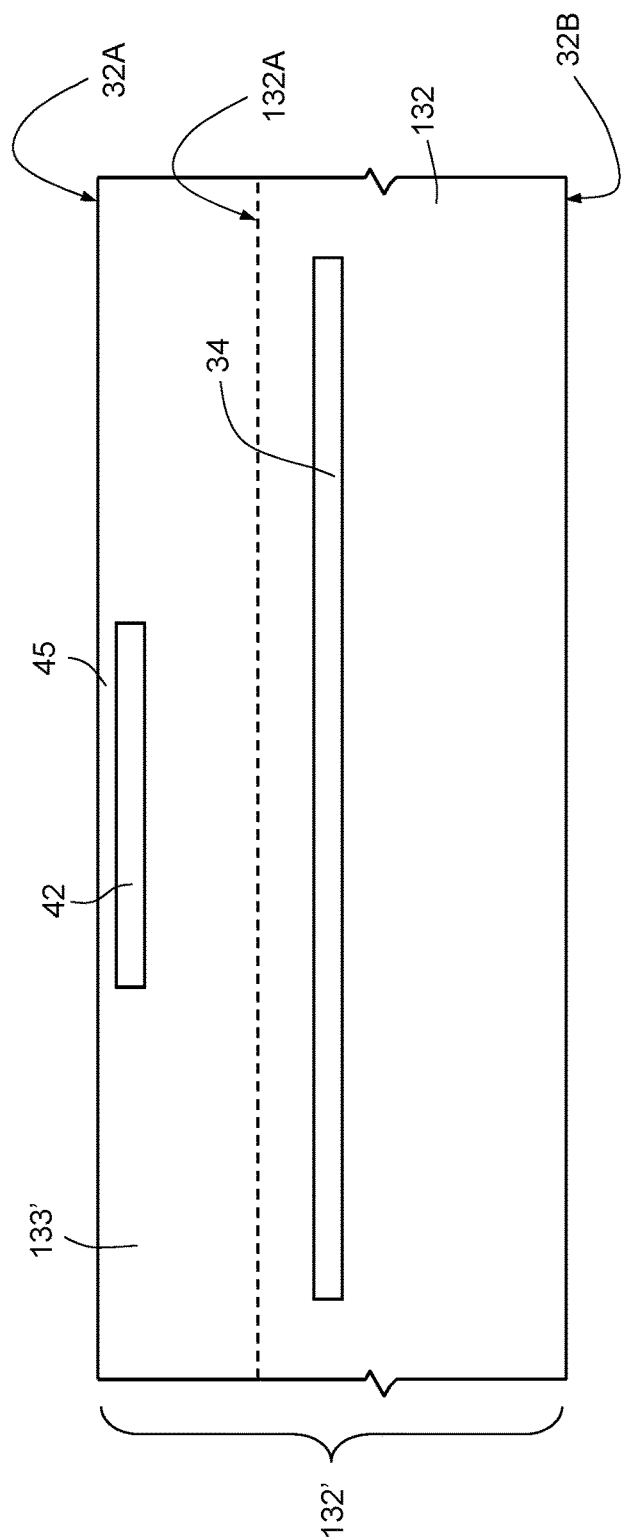

ULTRASONIC MEMS ACOUSTIC TRANSDUCER WITH REDUCED STRESS SENSITIVITY AND MANUFACTURING PROCESS THEREOF

BACKGROUND

Technical Field

The present disclosure relates to an ultrasonic acoustic transducer of a MEMS (MicroElectroMechanical System) type with reduced stress sensitivity and to the manufacturing process thereof.

Description of the Related Art

Acoustic transducers obtained using the semiconductor technology, which operate according to a capacitive or piezoelectric principle for transduction of ultrasonic acoustic waves are known. In particular, these transducers are known as MUTs (Micromachined Ultrasonic Transducers) and may be either of a capacitive type (CMUTs, Capacitive Micromachined Ultrasonic Transducers) or of a piezoelectric type (PMUTs, Piezoelectric Micromachined Ultrasonic Transducers). In the following, reference will be made to PMUT acoustic transducers, without this, however, implying any loss of generality.

FIG. 1 schematically shows a PMUT acoustic transducer 1 (in the following, referred to as transducer 1).

In particular, the transducer 1 comprises a body 3, of semiconductor material (for example, silicon), having a first 3A and a second surface 3B.

The body 3 has a cavity 5, extending in the body 3 from the second surface 3B; in particular, the cavity 5 is delimited, at the side, by a wall 5A and, at the top, by a bottom surface 5B. A portion of the body 3 delimited between the bottom surface 5B and the first surface 3A of the body 3 forms a membrane 7, which is thus monolithic with the body 3.

A piezoelectric actuator 10 extends on the first surface 3A of the body 3; in particular, the piezoelectric actuator 10 is formed by a stack of layers. In greater detail, the stack of layers comprises a first electrode 12; a piezoelectric layer 13, for example of PZT (lead titanate zirconate, $Pb[Zr_xTi_{1-x}]O_3$) or aluminum nitride (AlN), which extends on the first electrode 12; and a second electrode 14, which extends on the piezoelectric layer 13.

At the second surface 3B of the body 3, the transducer 1 is coupled, through a bonding layer 16 (for example, a glue or oxide), to a board 19 (e.g., a PCB, Printed-Circuit Board).

In use, the transducer 1 can operate according to various operating modes, for example as an emitter or a receiver.

When the transducer 1 is used as an emitter, a periodic potential difference is applied between the first and the second electrodes 12, 14 of the piezoelectric actuator 10 so as to generate a periodic deflection of the membrane 7 in a direction parallel to an axis Z of a cartesian reference system XYZ and generate an ultrasonic acoustic wave.

When the transducer 1 is used as a receiver, the membrane 7 of the transducer 1 is deflected by an incident ultrasonic acoustic wave and generates a periodic mechanical stress in the piezoelectric layer 13. Thus, a periodic potential difference which can be read by a reading circuit (not illustrated) coupled to the transducer 1 is created between the first and the second electrodes 12, 14 of the piezoelectric actuator 10.

One or more transducers of the type illustrated in FIG. 1 can be used in various application fields.

For instance, FIG. 2 shows a sensing system 20 capable of determining the distance of an object that is at least in part reflecting, by measuring, in a per se known manner, a time of flight (ToF). In practice, the sensing system 20 uses two transducers 1 (respectively referred to as first transducer 21 and second transducer 23 in FIG. 2), which operate, respectively, as an emitter and a receiver, and measures the time that elapses between emission of a first ultrasonic acoustic wave, generated by the first transducer 21, and reception, by the second transducer 23, of a second acoustic wave, generated by reflection of the first acoustic wave by the object to be measured, designated by reference number 22.

In the considered example, the first and the second acoustic transducers 21, 23 have a first resonance frequency $f_{r1}$ and a second resonance frequency $f_{r2}$, respectively. In use, the first transducer 21 is actuated in resonance conditions, i.e., it emits an ultrasonic acoustic wave $S_i$ (hereinafter defined as emitted wave $S_i$) at its own first resonance frequency $f_{r1}$. In this way, the displacement of the membrane and the emitting power of the first transducer 21 are maximized. The emitted wave $S_i$ is reflected by the object 22 and generates a reflected wave $S_r$, having, to a first approximation, the same oscillation frequency $f_{r1}$ as the emitted wave $S_i$. The reflected wave $S_r$ is detected by the second transducer 23 and transduced into an electrical output signal in a per se known manner.

If the first resonance frequency $f_{r1}$ is equal to the second resonance frequency $f_{r2}$, the displacement of the membrane of the second transducer 23, induced by the reflected wave $S_r$, is amplified; consequently, the sensing system 20 has high sensitivity and a high SNR (Signal-to-Noise Ratio), and the electrical output signal is amplified.

Instead, if the first and the second resonance frequencies $f_{r1}$, $f_{r2}$ are mismatched and a frequency offset $\Delta f$ is present, the displacement induced on the membrane of the second transducer 23 is smaller and, consequently, the sensitivity is lower, the SNR is lower and the electrical output signal is reduced.

The frequency offset $\Delta f$ may, for example, be due to the presence of undesirable periodic mechanical stresses on the membrane of the first transducer 21, which may cause undesirable deflections of the membrane. These mechanical stresses are due to various factors, such as temperature, humidity, bonding to a package, EWS (Electrical Wafer Sorting) testing, and bending phenomena.

Similar problems may arise in transducer systems of the type illustrated in FIG. 1 used for triangulation and mapping of the position of an object with respect to a reference space (for example, a three-dimensional space defined by the cartesian reference system XYZ).

Even in this case, PMUTs preferably operate in resonance conditions; consequently, the resonance frequency is an important parameter for the proper operation of a PMUT.

BRIEF SUMMARY

One or more embodiments of the present disclosure are directed to an acoustic transducer and a manufacturing process. In at least one embodiment, the acoustic transducer may be less sensitive to stresses.

BRIEF DESCRIPTION OF THE SEVERAL VIEWS OF THE DRAWINGS

For a better understanding of the present disclosure, preferred embodiments thereof are now described purely by way of non-limiting example, with reference to the attached drawings, wherein:

FIGS. 6-11 show successive steps of an embodiment of a manufacturing process of the acoustic transducer of FIGS. 3-5;

DETAILED DESCRIPTION

Figure 3:
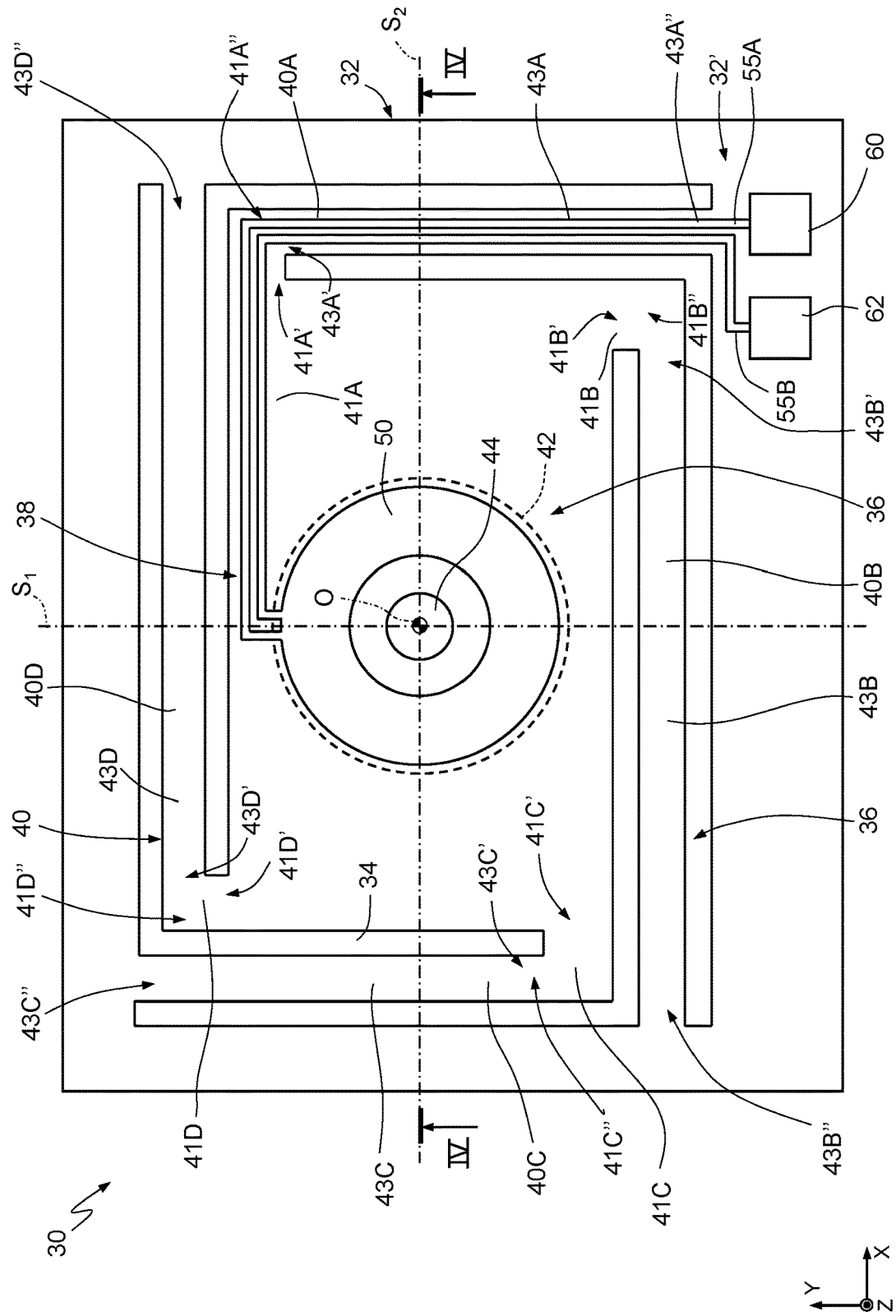
FIG. 3 shows an embodiment of the present acoustic transducer in top plan view.
Figure 4:
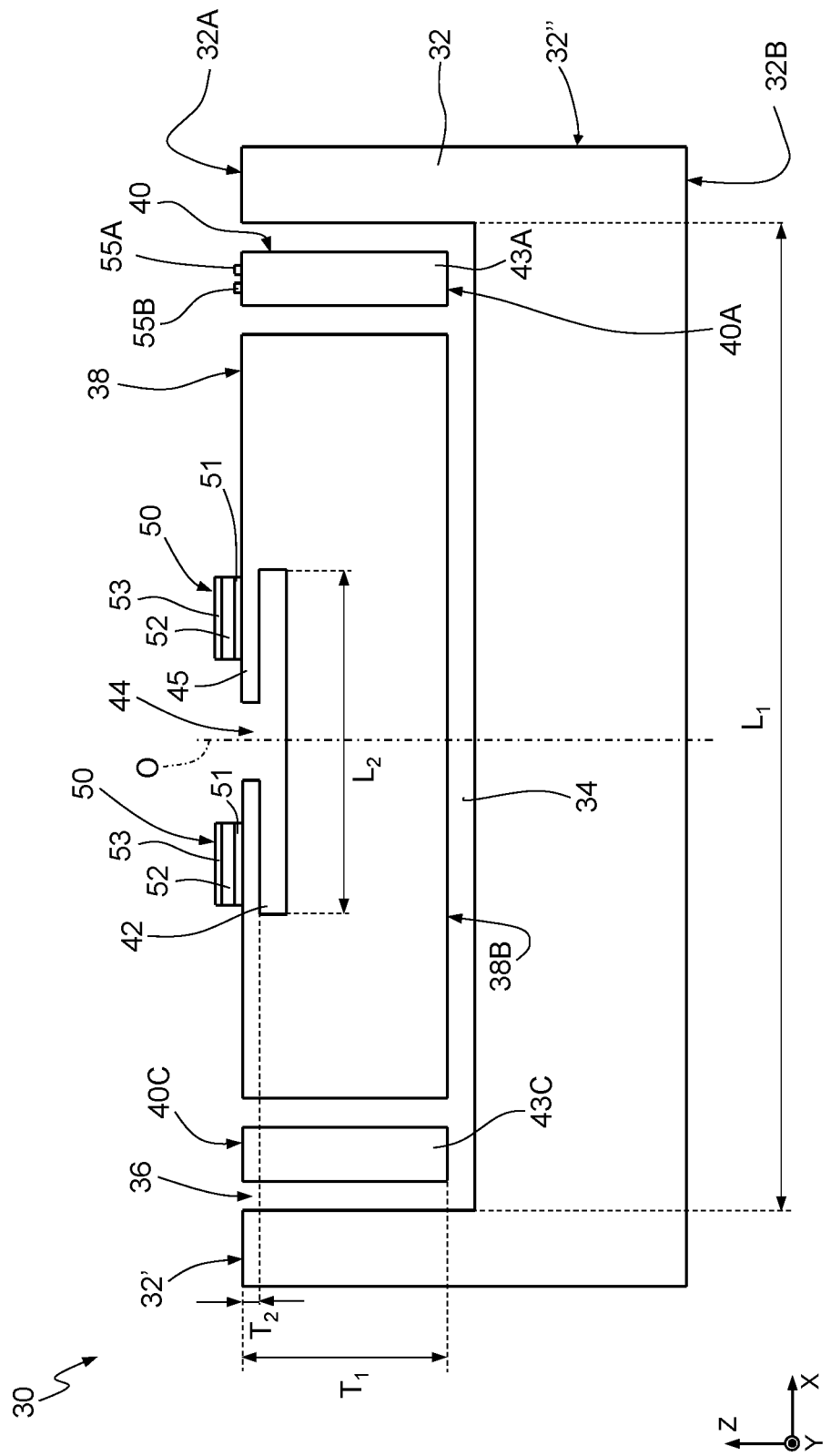
FIG. 4 shows a cross section, taken along the section line IV-IV, of the acoustic transducer of FIG. 3.

FIGS. 3 and 4 schematically shows a transducer 30 of a PMUT type having a first and a second planar extension axes $S_1$, $S_2$, parallel, respectively, to an axis Y and an axis X of a cartesian reference system XYZ, and an axis of rotational symmetry through 180° O (hereinafter also referred to as central axis O), extending parallel to an axis Z of the cartesian reference system XYZ. In particular, in the illustrated embodiment, the transducer 30 has a rotational symmetry through 180°, i.e., for each element present in the structure, there exists a corresponding element of the same dimensions and shape arranged rotated through 180° about the central axis O.

In particular, FIG. 4, the transducer 30 comprises a body 32 of semiconductor material (for example of silicon), having a first surface 32A and a second surface 32B, opposite to one another.

The body 32 houses a first cavity 34, having, for example, a quadrangular (e.g., rectangular) shape in top plan view (FIG. 3), the top surface whereof is arranged at a first depth $T_1$ from the first surface 32A in a direction parallel to the axis Z of the cartesian reference system XYZ and is parallel to a plane XY of the reference system XYZ; and a plurality of decoupling trenches 36 (four illustrated in FIG. 3), extending from the first surface 32A as far as the first cavity 34. Moreover, the first cavity 34 has a first length $L_1$ measured along the axis X of the cartesian reference system XYZ (FIG. 4).

The decoupling trenches 36 are, for example, L-shaped in top plan view (FIG. 3) and laterally delimit a sensitive portion 38 of the body 32, extending over the first cavity 34.

In practice, the sensitive portion 38 of the body 32 is separated from a peripheral portion 32' of the body 32 by the decoupling trenches 36 and by an underlying portion 32" of the body 32 via the cavity 34. The decoupling trenches 36 put the first cavity 34 in communication with the external environment.

Moreover, the decoupling trenches 36 laterally delimit between them a plurality of spring elements 40 (four illustrated in FIG. 3). The spring elements 40 are, for example, L-shaped in top plan view (FIG. 3), support the sensitive portion 38, and connect it to the peripheral portion 32' of the body 32.

The spring elements 40 here comprise a first, a second, a third and a fourth spring elements 40A-40D, each comprising a respective first arm 41A-41D and a respective second arm 43A-43D. The first and the second arms 41A-41D, 43A-43D are transverse (in particular, perpendicular) to one another. In particular, the first and third spring elements 40A, 40C are symmetrical to one another through 180° about the central axis O, i.e. they can be obtained by rotating, for example, the first spring element 40A through 180° about the central axis O. Likewise, the second and fourth spring elements 40B, 40D are symmetrical through 180° about the central axis O. Consequently, the spring elements 40A-40D are symmetrical in pairs with respect to the central axis O and are arranged to surround the sides of the sensitive portion 38.

In greater detail, the first arm 41A, 41C of the first and third spring elements 40A, 40C extends parallel to the axis X and is connected, at a respective first end 41A', 41C', to the sensitive portion 38. The second arm 43A, 43C of the first and third spring elements 40A, 40C extends parallel to the axis Y and is connected, at a first end 43A', 43C', to a second end 41A", 41C" of the respective first arm 41A, 41C and, at a second end 43A"', 43C"', to the peripheral portion 32'.

The first arm 41B, 41D of the second and fourth spring elements 40B, 40D extends parallel to the axis Y and is connected, at a respective first end 41B', 41D', to the sensitive portion 38. The second arm 43B, 43D of the second and fourth spring elements 40B, 40D extends parallel to the axis X and is connected, at a first end 43B', 43D', to a second end 41B", 41D" of the respective second arm 41B, 43B and, at a second end 43B"', 43D"', to the peripheral portion 32'.

Moreover, the spring elements 40A-40D and the sensitive portion 38 have a thickness (along the axis Z), for example, of between 10 μm and 80 μm.

The sensitive portion 38 has a top surface formed by the first surface 32A of the body 32 and a bottom surface 38B, and is delimited underneath by the first cavity 34 at the bottom surface 38B. Moreover, the sensitive portion 38 houses a second cavity 42, having, for example, a circular shape centered on the central axis O (FIG. 3) and extending underneath the first surface 32A of the body 32 starting from a second depth $T_2$ in a direction parallel to the axis Z. The second depth $T_2$ is smaller than the first depth $T_1$ of the first cavity 34. The second cavity 42 has a diameter $L_2$ smaller than the length $L_1$ of the first cavity 34; moreover, the first cavity 34 projects on all sides (in a plane parallel to the plane XY of the cartesian reference system XYZ) with respect to the second cavity 42.

The sensitive portion 38 defines a membrane 45, delimited at the top by the first surface 32A of the body 32 and at the bottom by the second cavity 42.

A ventilation hole 44 extends in the sensitive portion 38, from the first surface 32A of the body 32 as far as the second cavity 42 through the thickness of the membrane 45; in particular, the ventilation hole 44 has, for example, a circular shape in top plan view (FIG. 3) and is arranged along the central axis O. The ventilation hole 44 puts the second cavity 42 in communication with the external environment; in this way, it is possible to equalize the pressure acting on the membrane 45.

A piezoelectric actuator 50 extends on the first surface 32A of the body 32, on top of the membrane 45. In detail, the piezoelectric actuator 50 is formed by a stack of layers, comprising a first electrode 51 (for example, of titanium, molybdenum, or platinum); a piezoelectric layer 52, for example of PZT or aluminum nitride (AlN), extending on the first electrode 51; and a second electrode 53 (for example, of TiW, an alloy of titanium and tungsten, or molybdenum), which extends on the piezoelectric layer 52.

The piezoelectric actuator 50 has, for example, an annular shape centered on the central axis O; in particular, the piezoelectric actuator 50 surrounds the ventilation hole 44 at a distance therefrom.

The first and the second electrodes 51, 53 of the piezoelectric actuator 50 are connected, through first and second conductive paths 55A, 55B (schematically illustrated in FIG. 3), to first and second contact pads 60, 62, respectively, which are arranged in the peripheral portion 32' of the body 32. In particular, the first and the second conductive paths 55A, 55B are of conductive material, such as molybdenum (Mo), gold (Au), aluminum (Al), or an alloy of aluminum and copper (AlCu). In addition, the first and the second contact pads 60, 62 are also of conductive material, such as metal, e.g., gold (Au), aluminum (Al), or else an alloy of aluminum and copper (AlCu).

In the present embodiment, the first and the second conductive paths 55A, 55B extend over the second spring element 40B and pass through it until the first and the second contact pads 60, 62.

In use, the transducer 30 operates according to the operating modes described in the following.

According to a first operating mode, a periodic potential difference (having an oscillation frequency, for example, equal to a first frequency f') is applied between the first and the second electrodes 51, 53 of the piezoelectric actuator 50 so as to induce a periodic mechanical stress in the piezoelectric layer 52 at the first frequency f' and, thus, generate a periodic deflection of the membrane 45 in a direction parallel to the axis Z at the first frequency f'. The periodic deflection of the membrane 45 enables the transducer 30 to emit an acoustic wave, in particular an ultrasonic wave, thus operating as an emitter.

According to a second operating mode, the transducer 30 operates as a receiver of ultrasonic acoustic waves. In this case, the membrane 45 of the transducer 30 is periodically deflected as a result of an ultrasonic acoustic wave (with an oscillation frequency equal to a second frequency f"), coming from the external environment, incident upon the membrane 45. The periodic deflection of the membrane 45 at the second frequency f" generates a periodic mechanical stress in the piezoelectric layer 52 and, thus, a periodic potential difference between the first and the second electrodes 51, 53 of the piezoelectric actuator 50 at the second frequency f". In particular, the periodic potential difference between the first and the second electrodes 51, 53 can be read by a reading circuit (not illustrated) electrically coupled to the transducer 30.

In some operating modes, the first and the second frequencies f', f" correspond to the resonance frequency of the piezoelectric actuator 50.

In both operating modes, the present transducer 30 has a reduced sensitivity to the external stresses, in particular to mechanical stresses.

In fact, the first cavity 34, the decoupling trenches 36 and the spring elements 40 enable decoupling of the sensitive portion 38 from the peripheral portion 32' and from the underlying portion 32" of the body 32, reducing the impact on the membrane 45 exerted by possible mechanical stresses in the portions 32' and 32", and consequent variation of the resonance frequency of the transducer 30.

In particular, the mass and stiffness of the spring elements 40 are designed to define the dynamic behavior and, thus, their resonance frequency. In greater detail, the spring elements 40 are designed so that their resonance frequency is lower than the resonance frequency of the membrane 45 (for example, by one or two decades). In this way, it is possible to prevent energy transfer between the spring elements 40 and the sensitive portion 38, a transfer that could have an adverse effect on the deflection capacity of the membrane 45 (in particular, the oscillation amplitude of the membrane 45).

In other embodiments, the transducer 30 may also comprise just two spring elements opposite to one another with respect to the first or second planar extension axes $S_i$, $S_2$; for example, with reference to FIGS. 3 and 4, just the first and third spring elements 40A, 40C or, alternatively, the second and fourth spring elements 40B, 40D may be provided.

Figure 5:
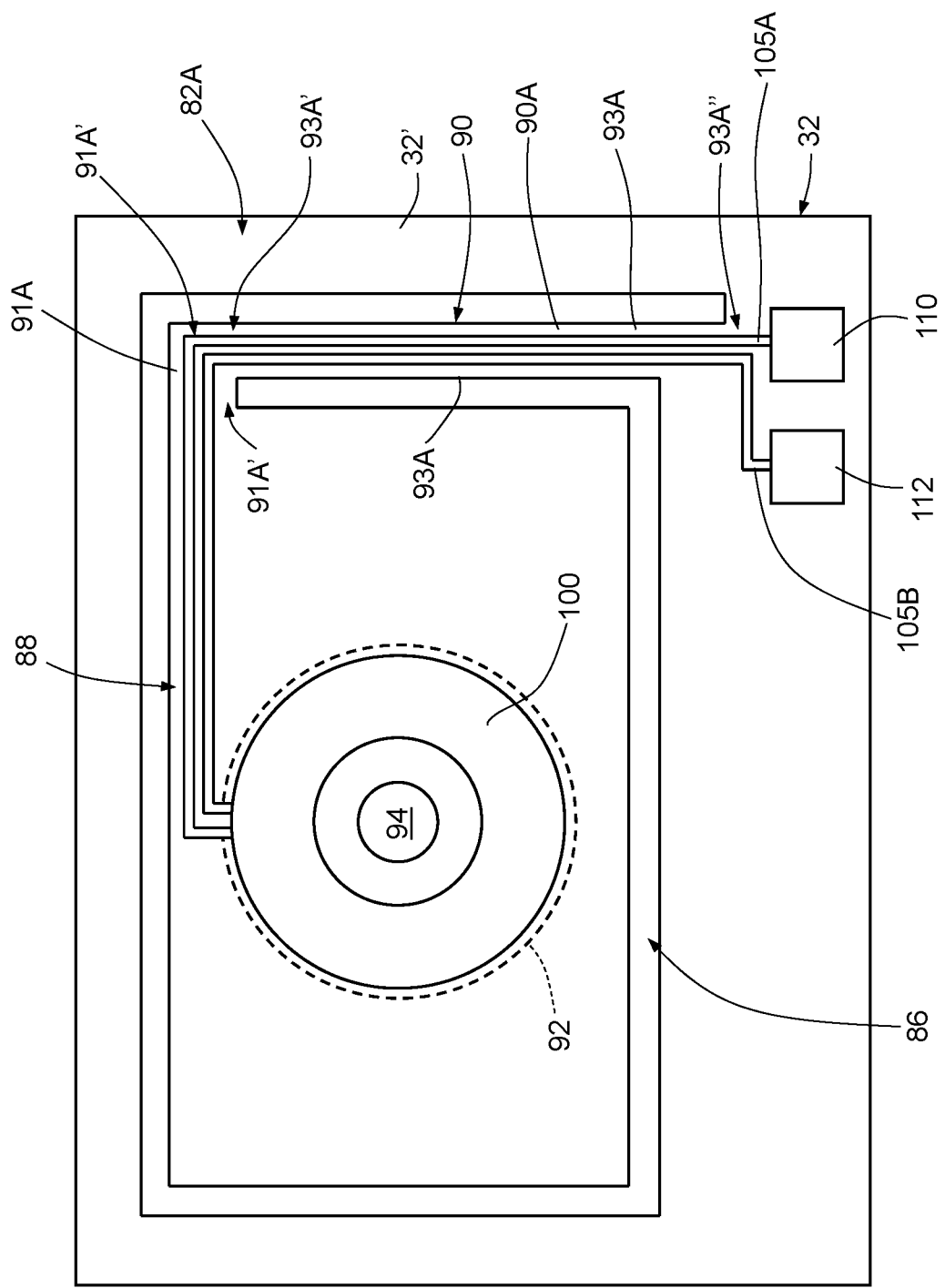
FIG. 5 shows another embodiment of the present acoustic transducer in top plan view.

In further embodiments, the transducer may also comprise just one spring element. In this regard, FIG. 5 shows a transducer 80 having a general structure similar to the transducer 30 of FIGS. 3-4; consequently, parts similar to the ones illustrated and described with reference to FIGS. 3-4 are designated in FIG. 5 by the same reference numbers increased by 50 and will not be described any further. In particular, the transducer 80 here comprises the spring element 90A, similar to the first spring element 40A of the transducer 30 of FIGS. 3-4.

The transducer 30 of FIGS. 3-4 is manufactured as described hereinafter with reference to FIGS. 6-11.

Initially, FIG. 6, a wafer 132 of monocrystalline silicon is machined so as to form the first buried cavity 34. The first buried cavity 34 may be formed in various ways, for example, as taught in U.S. Pat. Pub. No. 2005/0208696, which is incorporated herein by reference.

With reference to FIG. 7, an epitaxial layer 133' of monocrystalline or polycrystalline silicon (represented by a dashed line in FIG. 7) is grown on a face 132A of the wafer 132, designated in FIG. 7 by 132'. In particular, the wafer 132' has a top face corresponding to the first surface 32A and a bottom face corresponding to the second surface 32B of the body 32 of FIGS. 3-4.

The wafer 132' is machined so as to form the second buried cavity 42 of the transducer 30. In particular, the second buried cavity 42 may be formed in various ways, for example as taught in U.S. Pat. Pub. No. 2005/0208696 and, consequently, in a way similar to the first buried cavity 34.

The membrane 45 of the transducer 30 is thus formed on the second buried cavity 34.

Figure 8:
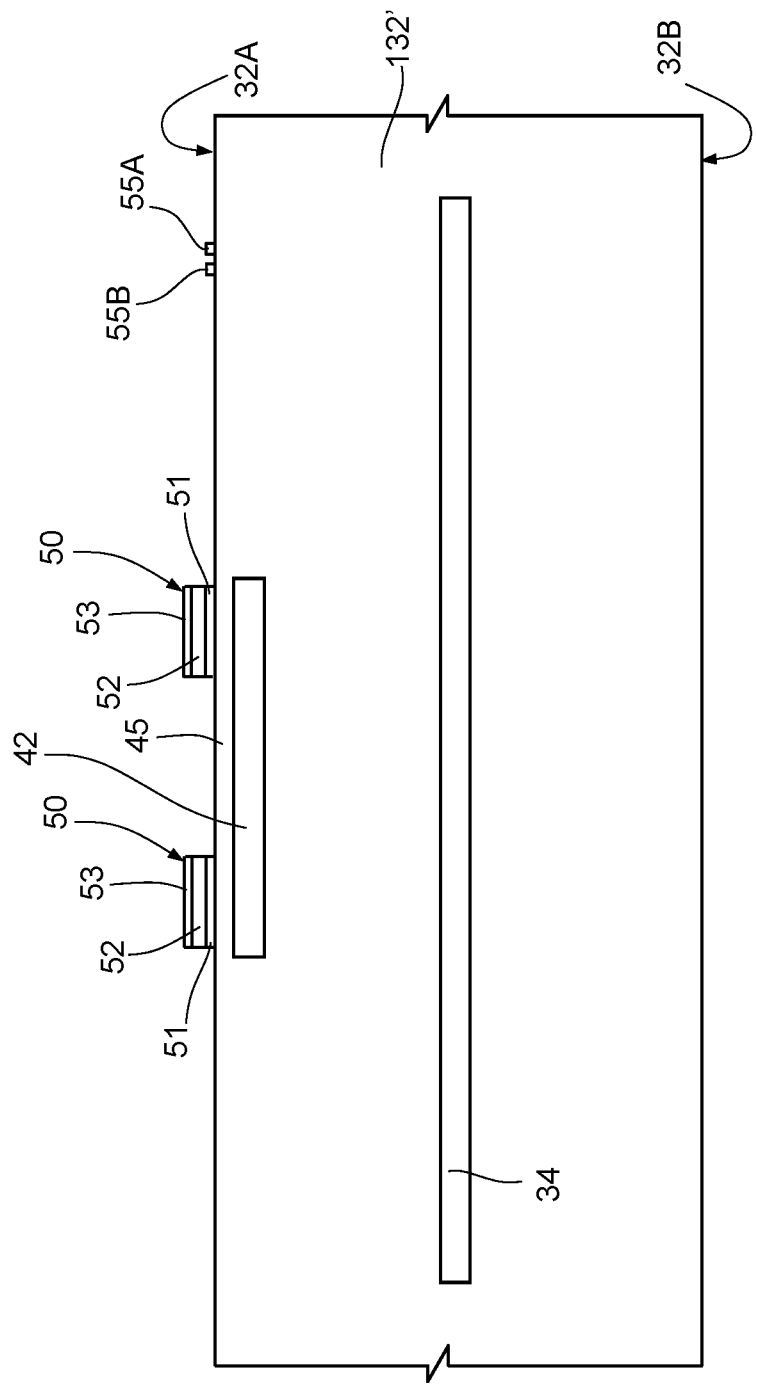

With reference to FIG. 8, the piezoelectric actuator 50 is formed on the top face 32A of the wafer 132' by depositing a stack of layers and defining them, in a known way. In this step, the conductive paths 55A, 55B are made, for example, of the same material of, and simultaneously with, one of the electrodes 51, 53, in a known way.

Subsequently or simultaneously with the conductive paths 55A, 55B, the contact pads 60, 62 are formed.

Figure 9:
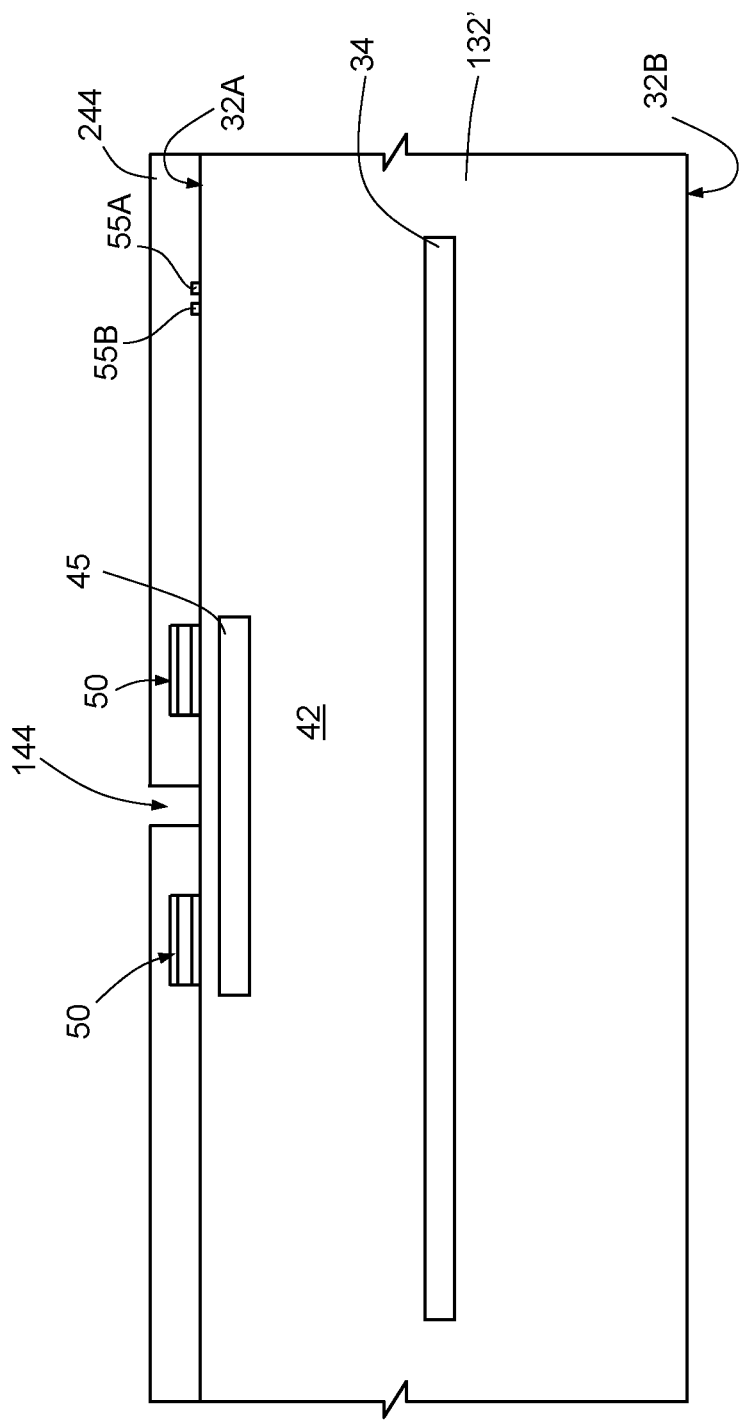

Thereafter, FIG. 9, a first mask 244 of oxide (for example, of silicon oxide) is formed in a per se known manner. In particular, the first mask 244 has an opening 144 where it is desidered to subsequently form the ventilation hole 44.

Figure 10:
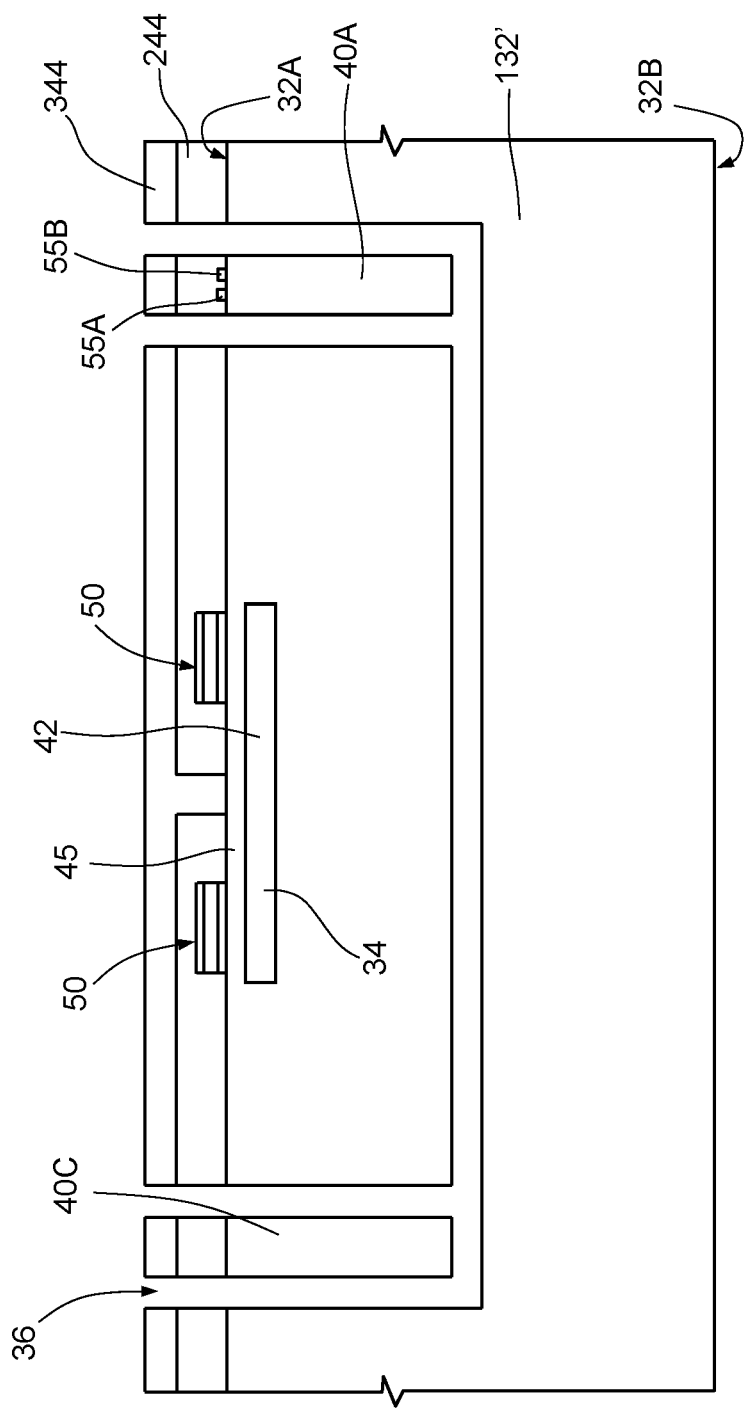

With reference to FIG. 10, a second mask 344, for example a resist mask, is provided in a known way on the first mask 244 and in the ventilation opening 144.

Using the second mask 344, the first mask 244 and the wafer 132' are etched using a known anisotropic etching technique, for example, DRIE (Deep Reactive Ion Etch) until the first buried cavity 34. At the end of the etching, the decoupling trenches 36 and the spring elements 40 are obtained.

Figure 11:
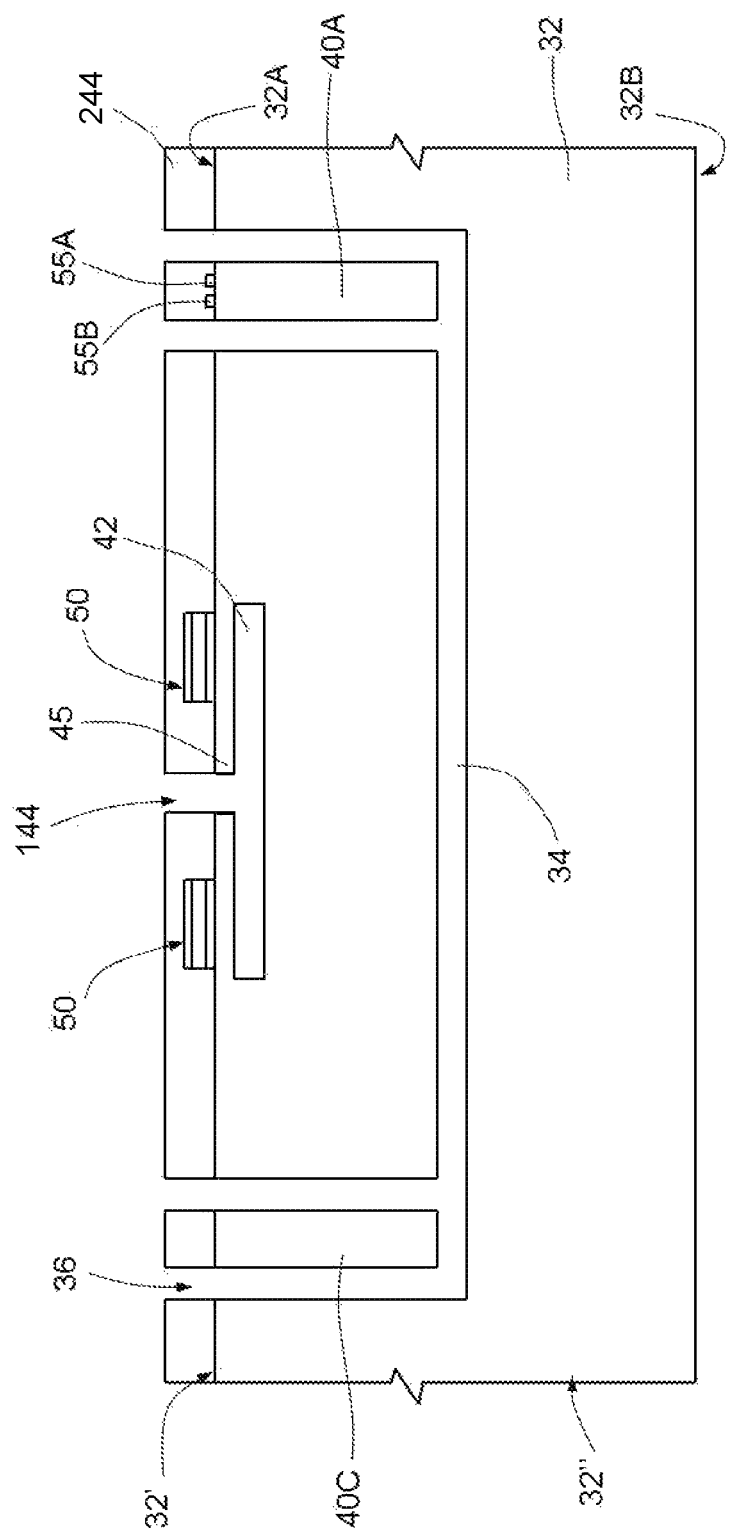

With reference to FIG. 11, the second mask 344 is removed, and a further anisotropic etching is carried out from the top face 32A to a depth as far as the second buried cavity 42. At the end of the etching, the membrane 45 and the ventilation hole 44 are obtained.

The first mask 244 is removed in a per se known manner (for example, by wet etching with hydrofluoric acid, HF), and the wafer 132' is diced so as to obtain the transducer 30 of FIGS. 3-4.

The present manufacturing process can be used also for manufacturing the transducer 80 of FIG. 5; to this end, the shape of the first and the second masks 244, 344 are modified to define the shape of the spring element 90A and of the decoupling trenches 86.

Figure 12:
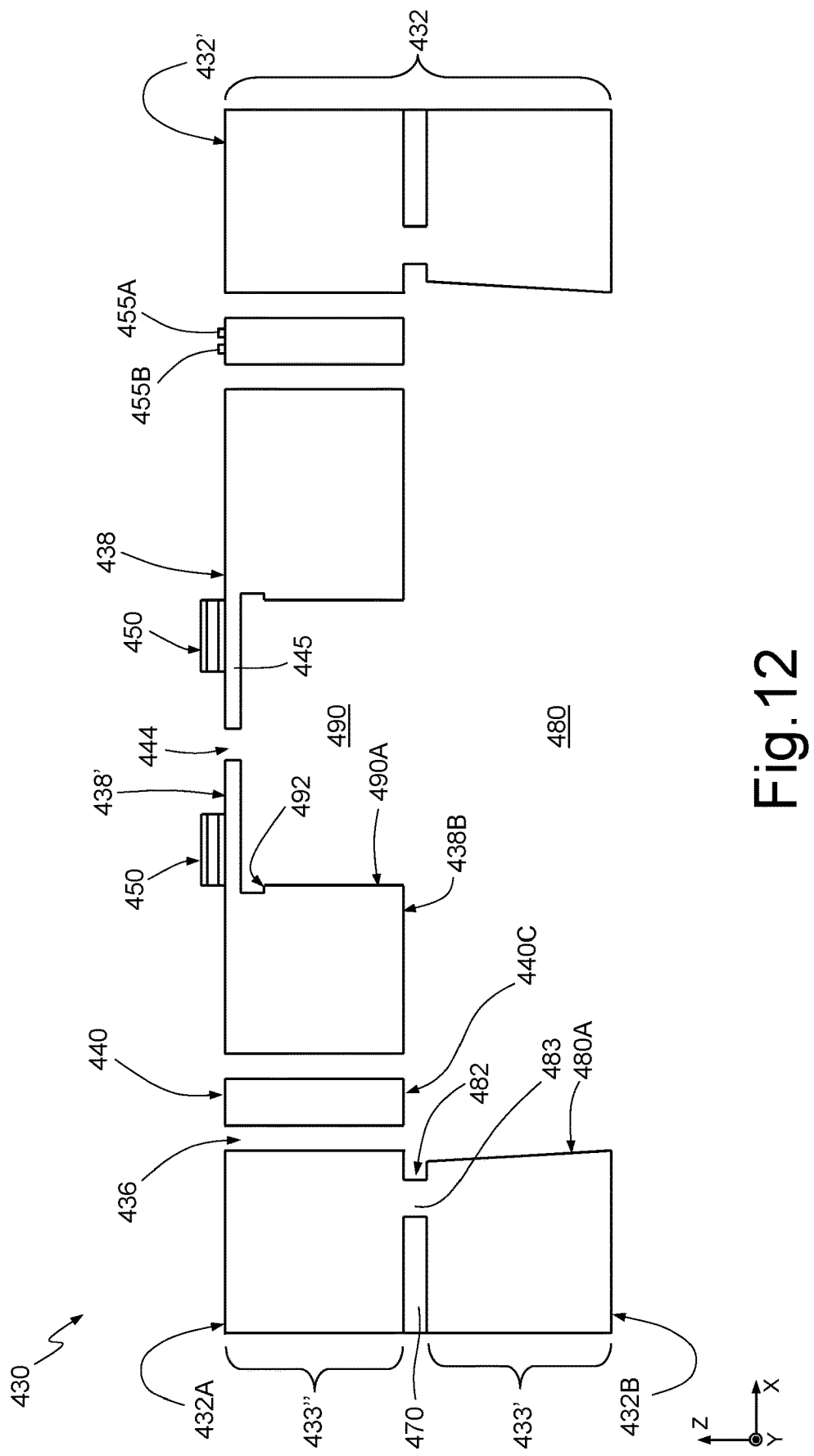
FIG. 12 is a cross-sectional view, taken along the section line IV-IV of FIG. 3, of a further embodiment of the present acoustic transducer.

FIG. 12 shows another embodiment of the present transducer. In detail, FIG. 12 shows a transducer 430 having a general structure similar to the MEMS pressure sensor 30 of FIGS. 3-4. Thus, parts similar to the ones illustrated and described with reference to FIGS. 3-4 are designated in FIG. 12 by the same reference numbers increased by 400 and will not be described any further.

In FIG. 12, the body 432 comprises a first body portion 433' and a second body portion 433".

In particular, the first body portion 433' is delimited at the bottom by the second surface 432B and is traversed by a through cavity 480, laterally delimited by a first cavity wall 480A in the body 432.

A dielectric layer 470, for example of silicon oxide ($SiO_2$) extends over the first body portion 433'.

The second body portion 433" extends on the dielectric layer 470 and is delimited at the top by the first surface 432A.

In the present embodiment, the second body portion 433" comprises the sensitive portion 438, the plurality of spring elements 440, as well as the peripheral portion 432' of the body 432. The second body portion 433" further comprises an anchorage element 483, having a closed shape (two portions whereof are visible in FIG. 12) and extends towards the second body portion 433" through the dielectric layer 470; consequently, the anchorage element 483 has the same thickness as the intermediate layer 470 (measured along the axis Z) and here is monolithic with the first and the second body portions 433', 433".

The dielectric layer 470 has a through opening 482 formed as a continuation of the through cavity 480, but having a greater area than the latter, so as to be recessed and offset with respect to the first cavity wall 480A of the first through cavity 480. Both the through cavity 480 and the through opening 482 have an area (in top plan view, parallel to the plane XY) greater than the sensitive portion 438, which is thus suspended over them.

The sensitive portion 438 has, starting from its bottom surface 438B, a blind cavity 490, laterally delimited by a second cavity wall 490A in the sensitive portion 438 and, on its bottom wall, by the membrane 445. In detail, the blind cavity 490 is a continuation of the through cavity 480 and of the through opening 482. A recess 492 extends alongside the blind cavity 490, at the bottom wall of the latter, so as to be recessed with respect to the second cavity wall 490A.

The transducer 430 of FIG. 12 is manufactured as described hereinafter with reference to FIGS. 13-15.

Figure 13:
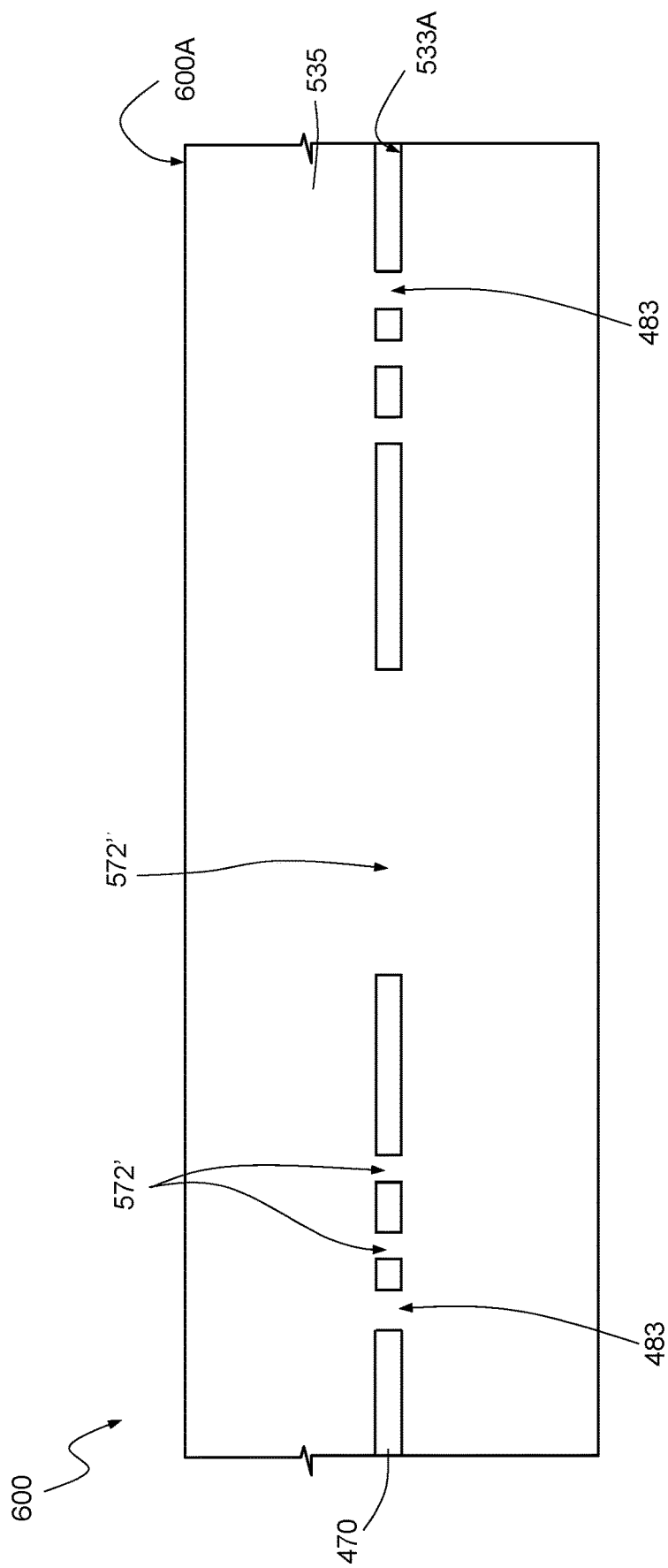
FIGS. 13-15 show successive steps of another embodiment of the present manufacturing process of the acoustic transducer of FIG. 12.

Initially, FIG. 13, the dielectric layer 470 (for example, of silicon oxide) is deposited and defined on a face 533A of a wafer 533 of monocrystalline silicon in a per se known manner; in particular, the dielectric layer 470 has first definition openings 572' and a second definition opening 572".

A first structural layer 535 of monocrystalline or polycrystalline silicon is epitaxially grown on the dielectric layer 470. In this step, the first structural layer 535 fills the first definition openings 572', as well as the second definition opening 572". In particular, in this step, the anchorage element 483 is formed. At the end of the epitaxial growth of the first structural layer 535, a wafer 600 is obtained.

Figure 14:
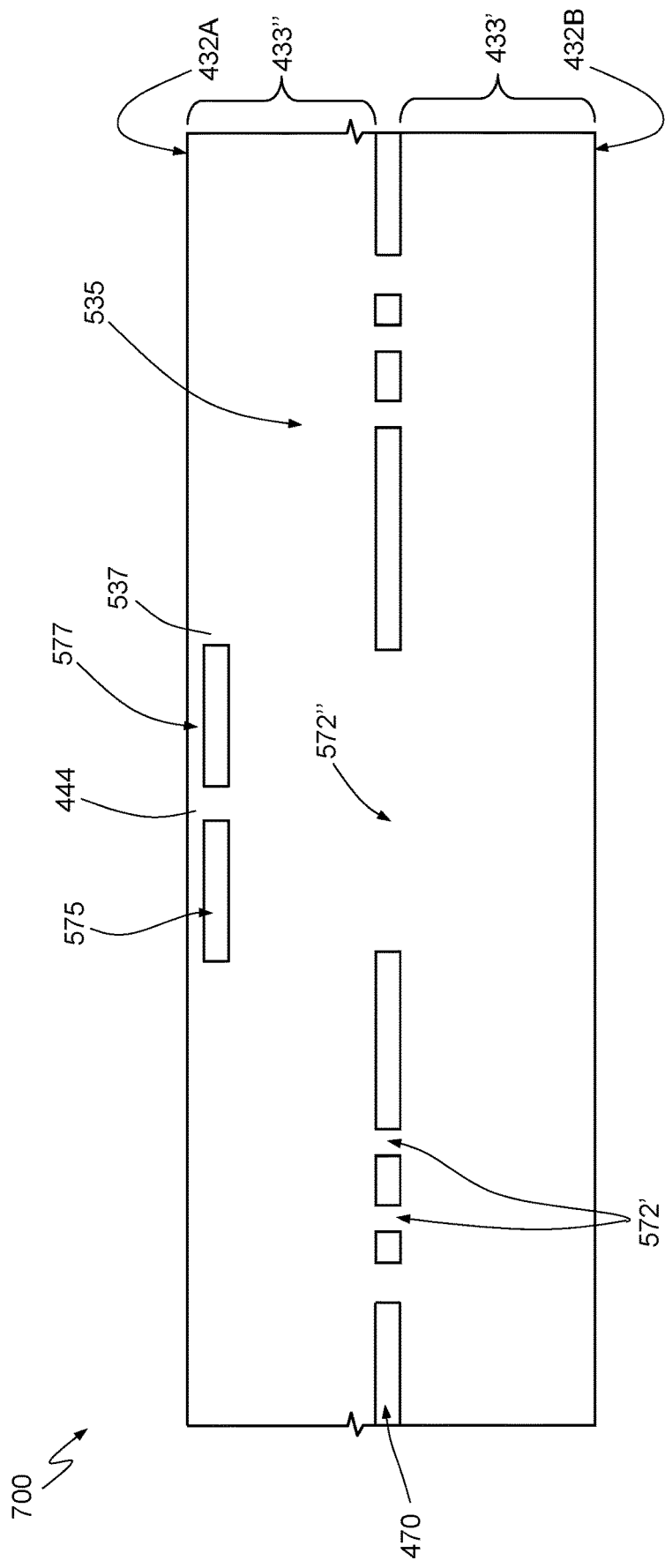
Figure 15:
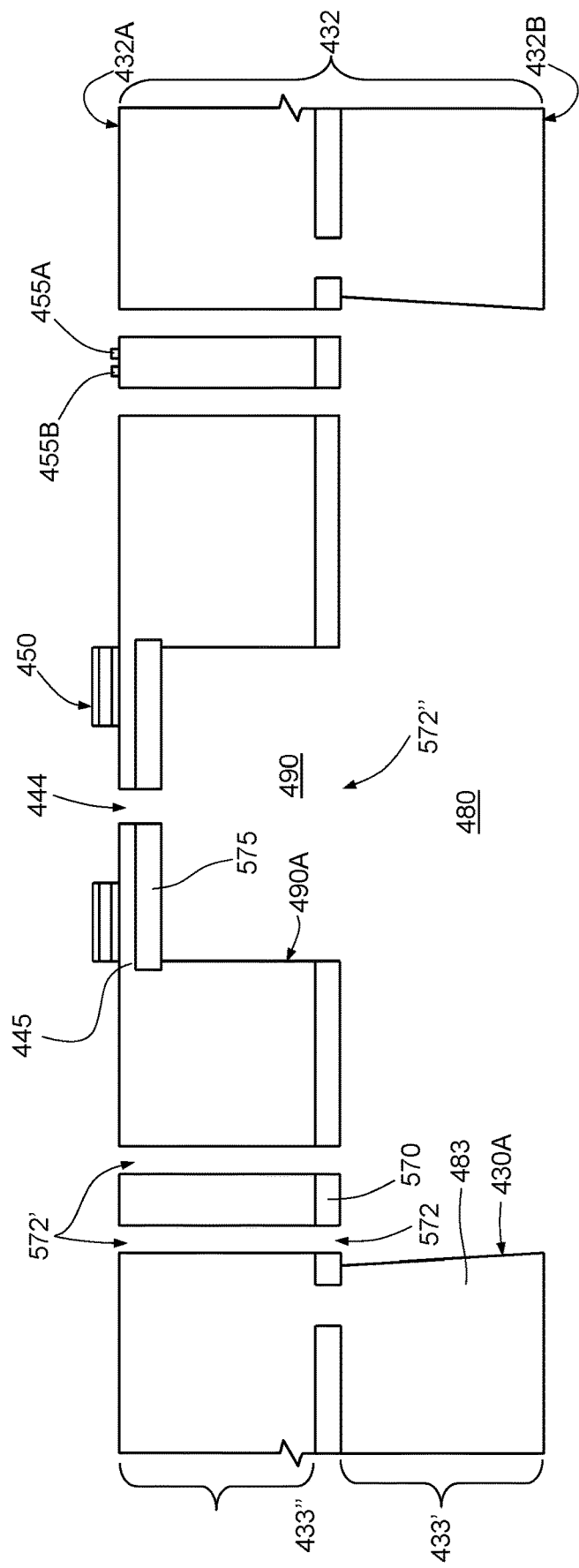

FIG. 14, a definition layer 575, of dielectric material (for example, of silicon oxide) is deposited and defined on a face 600A of the wafer 600 in a per se known manner. In particular, a third definition opening 577 and the ventilation opening 444 are formed.

A second structural layer 537 of monocrystalline or polycrystalline silicon is epitaxially grown on the surface of the definition layer 575 and of the first structural layer 535. In particular, the second structural layer 535 fills the third definition opening 577, as well as the ventilation opening 444. At the end of the process of epitaxial growth of the second structural layer 537, a wafer 700 is obtained, comprising the first body portion 433', the dielectric layer 470, and the second body portion 433" and having a top face corresponding to the first surface 432A and a bottom face corresponding to the second surface 432B of the body 432.

the stack of layers adapted to form the piezoelectric actuator 450 illustrated in FIG. 12, as well as the first and the second conductive paths 455A, 455B and the corresponding contact pads (not illustrated), is deposited on the first surface 432A in a way similar to what described with reference to FIG. 8.

The wafer 700 is etched from the backside starting from the second surface 432B.

In detail, a mask (not illustrated) is arranged on the second surface 432B and the wafer 700 is etched using a known etching technique (for example, dry etching).

The etch proceeds until the dielectric layer 470, to form the through cavity 480. Etching proceeds so as to remove the portions of semiconductor in the first definition openings 572' and in the second definition opening 572", as well as the underlying portions of the second body portion 433". In particular, in this step, the etch stops at the definition layer 575, thus forming the blind cavity 490, and proceeds elsewhere as far as the first surface 432A of the wafer 700, to form the ventilation hole 444 and the decoupling trenches 436, and define the sensitive portion 438 and the spring elements 440.

The mask on the second surface 432B of the wafer 700 is removed, and the portions of the dielectric layer 470 and of the definition layer 575 exposed by the previous etching step are removed in a per se known manner (for example, by wet etching with hydrofluoric acid, HF), to release the membrane 445. The wafer 700 is diced so as to obtain the transducer 430 of FIG. 12.

Figure 1:
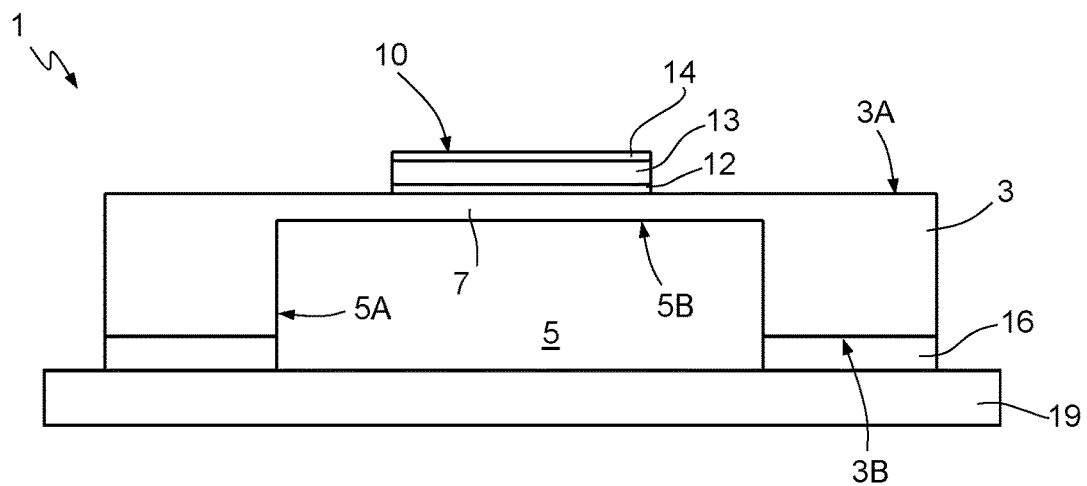
FIG. 1 schematically shows an acoustic transducer of a known type.
Figure 2:
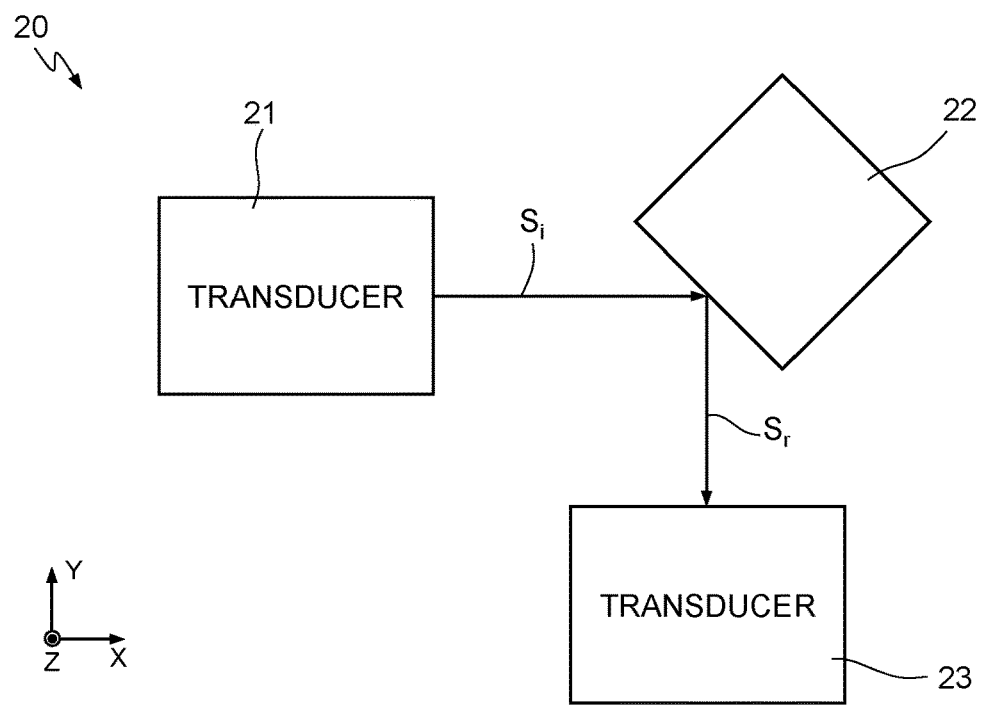
FIG. 2 schematically shows a system for detecting an object of a known type.

The transducers 30, 80, 430 of FIGS. 3-4, 5, and 12 can be used in systems of the type illustrated in FIG. 2 and, in general, in any positioning and/or triangulation system, in a way similar to what has been discussed with reference to FIGS. 1 and 2.

The present acoustic transducer and the process thereof have several advantages.

In particular, the spring elements are designed so as to decouple the sensitive portion (and thus the actuation membrane) from the rest of the body of the acoustic transducer and absorb existing mechanical stresses. In this way, the sensitive portion is physically and operatively isolated from the body of the acoustic transducer.

Reduction of the impact of the mechanical stresses on the sensitive portion thus enables a significant reduction of the frequency offset due to the mechanical stresses in the present acoustic transducer. Consequently, when the present acoustic transducer operates, for example, as an emitter in resonance conditions (and thus the membrane vibrates at the resonance frequency), the emitted ultrasonic acoustic wave will have a frequency substantially equal to the resonance frequency of the acoustic transducer. This advantage is particularly useful in emitter-receiver systems of the type illustrated in FIG. 2 and/or in generic positioning/triangulation systems that include a multiplicity of acoustic transducers of the type illustrated in FIGS. 3-5 and 12.

Finally, it is clear that modifications and variations may be made to the MEMS device and to the manufacturing process described and illustrated herein, without thereby departing from the scope of the present disclosure.

For instance, the various embodiments described may be combined so as to provide further solutions.

Moreover, multiple piezoelectric actuators, as well as respective membranes, respective second cavities, and respective ventilation holes, may be arranged in the sensitive portion 38, 438 of the acoustic transducer of the type illustrated in FIGS. 3-5 and 12 so as to increase the acoustic power emitted per unit surface of the acoustic transducer. For instance, the sensitive portion 38, 438 of the acoustic transducer 30, 430 may comprise a pair of piezoelectric actuators 50, 450, each associated with a respective membrane 45, 445, to a respective second cavity 42, 442, and to a respective ventilation hole 44, 444. In particular, the piezoelectric actuators 50, 450 (as well as the respective membranes 45, 445, the respective second cavities 42, 442, and the respective ventilation holes, 44, 444) may be arranged alongside one another along the axis X and/or Y of the reference system XYZ, for example in a way symmetrical with respect to the central axis O.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS acoustic transducer of an ultrasonic type, comprising:
    a body of semiconductor material, the body having first and second surfaces opposite to each other;
    a first cavity in the body;
    a sensitive portion suspended in the first cavity and extending between the first cavity and the first surface of the body, the sensitive portion including a second central cavity and a membrane extending between the second central cavity and the first surface of the body; and
    an elastic supporting structure coupling the sensitive portion to the body, the elastic supporting structure being suspended in the first cavity.

2. The MEMS acoustic transducer according to claim 1, further comprising:
    a peripheral portion; and
    a decoupling trench extending in the body from the first surface to the first cavity, the decoupling trench laterally delimiting the sensitive portion and the elastic supporting structure,
    wherein the elastic supporting structure is arranged between the sensitive portion and the peripheral portion.

3. The MEMS acoustic transducer according to claim 2, wherein the elastic supporting structure comprises one or more spring elements having an L-shape, each of the one or more spring elements comprising a first end and a second end, the first end being coupled to the sensitive portion, the second end being coupled to the peripheral portion of the body.

4. The MEMS acoustic transducer according to claim 1, wherein the elastic supporting structure comprises first, second, third, and fourth spring elements surrounding the sensitive portion, the first and the third spring elements being symmetrical to each other about a first axis of the body, the second and the fourth spring elements being symmetrical to each other about a second axis of the body, wherein the first axis is orthogonal to the second axis.

5. The MEMS acoustic transducer according to claim 1, wherein the membrane has:
    a ventilation hole extending through the membrane to the second central cavity; and
    a piezoelectric actuator coupled to a surface of the membrane.

6. The MEMS acoustic transducer according to claim 1, wherein the first cavity extends from the second surface of the body to the sensitive portion and is laterally delimited by a first cavity wall, the body further comprising a first body portion, a second body portion, and an anchorage element, wherein the anchorage element is arranged between the first and the second body portions in a recessed portion in the first cavity wall and defining a through opening offset with respect to the first cavity wall.

7. The MEMS acoustic transducer according to claim 6, wherein the second central cavity extends between the membrane and the first cavity and is laterally delimited by a second cavity wall, the second central cavity being in communication with the first cavity and forming a recess underneath the membrane, the recess being offset with respect to the second cavity wall.

8. A MEMS acoustic transducer, comprising:
    a semiconductor body including a first cavity and a second central cavity, the second central cavity facing the first cavity;
    a plurality of decoupling trenches extending from a first surface of the semiconductor body to the first cavity;
    a plurality of elastic supporting structures delimited by portions of adjacent decoupling trenches of the plurality of decoupling trenches, respectively; and
    a sensitive portion formed by the plurality of decoupling trenches, the second central cavity located in the sensitive portion, the sensitive portion including a membrane at the first surface of the semiconductor body.

9. The MEMS acoustic transducer according to claim 8, wherein the plurality of decoupling trenches are L-shaped in plan view at the first surface of the semiconductor body.

10. The MEMS acoustic transducer according to claim 8, wherein the portions of the adjacent decoupling trenches are ends of adjacent decoupling trenches.

11. The MEMS acoustic transducer according to claim 8, wherein the first cavity is a buried cavity, wherein the second central cavity is a buried cavity.

12. A device, comprising:
    a first central cavity in a semiconductor body;
    a sensitive portion suspended in the first central cavity, the sensitive portion including:
        a second central cavity; and
        a plurality of membrane portions extending over the second central cavity; and an elastic supporting structure suspended in the first cavity and coupling the sensitive portion to the semiconductor body, the elastic supporting structure being between the sensitive portion and the semiconductor body.

13. The device of claim 12, wherein the plurality of membrane portions extend from the sensitive portion towards each other.

14. The device of claim 13, wherein the sensitive portion includes a central ventilation opening between the plurality of membrane portions.

15. The device of claim 14, wherein the central ventilation opening is in fluid communication with an external environment and the second central cavity.

16. The device of claim 15, wherein the ventilation opening is in a first surface of the sensitive portion, the sensitive portion having a second surface opposite the first surface, the second surface being in the first central cavity and facing the semiconductor body.

17. The device of claim 16, wherein the ventilation opening has a circular shape in top plan view.

18. The device of claim 12, wherein the elastic supporting structure includes a first portion transverse to a second portion.

19. The device of claim 12, wherein the first central cavity extends in a first direction in the semiconductor body for a first dimension, the second central cavity extends in the first direction in the sensitive portion for a second dimension, the first dimension being greater than the second dimension.

20. The device of claim 12, comprising a first trench in the first central cavity, the first trench being between the elastic supporting structure and the semiconductor body.

* * * * *